(12) United States Patent
Meikle et al.

(10) Patent No.: US 6,429,086 B1
(45) Date of Patent: *Aug. 6, 2002

(54) METHOD OF DEPOSITING TUNGSTEN NITRIDE USING A SOURCE GAS COMPRISING SILICON

(75) Inventors: Scott Meikle; Trung Doan, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/977,800

(22) Filed: Nov. 25, 1997

Related U.S. Application Data

(63) Continuation of application No. 08/667,907, filed on Jun. 12, 1996, now Pat. No. 5,691,235, which is a continuation-in-part of application No. 08/348,646, filed on Nov. 30, 1994, now abandoned.

(51) Int. Cl.[7] .............................................. H01L 21/20
(52) U.S. Cl. ....................... 438/381; 438/648; 438/396; 438/644
(58) Field of Search ................................ 438/680, 381, 438/643, 644, 648, 653, 654, 656, 396

(56) References Cited

U.S. PATENT DOCUMENTS

| | | | |
|---|---|---|---|
| 4,238,872 A | 12/1980 | Akashi | 24/205.11 F |
| 4,774,201 A | 9/1988 | Woo et al. | 437/41 |
| 4,823,182 A | 4/1989 | Okumura | 357/67 |
| 4,847,111 A * | 7/1989 | Chow et al. | 438/586 |
| 4,884,123 A | 11/1989 | Dixit et al. | 357/71 |
| 4,923,715 A | 5/1990 | Matsuda et al. | 427/237 |
| 4,960,732 A | 10/1990 | Dixit et al. | 437/192 |
| 4,974,056 A | 11/1990 | Brodsky et al. | 357/71 |
| 5,124,780 A | 6/1992 | Sandhu et al. | 357/67 |
| 5,132,756 A | 7/1992 | Matsuda | 257/763 |
| 5,150,276 A | 9/1992 | Gonzalez et al. | 361/303 |
| 5,168,073 A | 12/1992 | Gonzalez et al. | 437/47 |
| 5,187,557 A | 2/1993 | Zenke | 257/310 |
| 5,192,703 A | 3/1993 | Lee et al. | 437/52 |
| 5,227,323 A | 7/1993 | Nishitsuji et al. | 437/47 |

(List continued on next page.)

FOREIGN PATENT DOCUMENTS

| | | | |
|---|---|---|---|
| JP | 60-193333 | 10/1985 | |
| JP | 02-177427 | 7/1990 | |
| JP | 05-129231 | 5/1993 | ......... H01L/21/285 |
| JP | 05-236282 | 9/1993 | ......... H01L/21/285 |
| JP | 6-275776 | 9/1994 | ......... H01L/27/04 |

OTHER PUBLICATIONS

Kim, et al., "New Method to improve the adhesion strength of tungsten thin film on silicon by W2N glue layer", *Appl. Phys. Lett.*, 61 (5), 537–539, (Aug. 3, 1992).

Lahav, et al., "Measurement of thermal expansion coefficients of W, Wsi, WN and WSin thin film metallizations", *J. Appl. Phys.*, 67 (2), 734–738, (Jan., 1990).

Nakajima, et al., "Preparation of Tungsten Nitride Film by CVD Method Using WF6", *J. Electroshem. Soc.: Solid State Science and Technology*, vol. 134, No. 12, 3175–3178, (Dec., 1987).

*Primary Examiner*—Tuan H. Nguyen
(74) *Attorney, Agent, or Firm*—Schwegman, Lundberg, Woessner & Kluth, P.A.

(57) ABSTRACT

A method for depositing tungsten nitride uses a source gas mixture having a silicon based gas for depositing the tungsten nitride to overlie a deposition substrate. A non-planar storage capacitor has a tungsten nitride capacitor electrode.

19 Claims, 2 Drawing Sheets

U.S. PATENT DOCUMENTS

| | | | |
|---|---|---|---|
| 5,238,872 A | 8/1993 | Thalapaneni et al. | 437/176 |
| 5,290,609 A | 3/1994 | Horike et al. | 427/576 |
| 5,336,638 A | 8/1994 | Suzuki et al. | 437/190 |
| 5,341,015 A | 8/1994 | Prall et al. | 257/412 |
| 5,341,016 A | 8/1994 | Prall et al. | 257/915 |
| 5,487,923 A | 1/1996 | Min et al. | 427/569 |
| 5,691,235 A * | 11/1997 | Meikle et al. | 438/680 |
| 5,861,675 A * | 1/1999 | Sasaki et al. | 257/764 |
| 5,888,588 A * | 3/1999 | Nagabushnam et al. | 438/680 |

* cited by examiner

METHOD OF DEPOSITING TUNGSTEN NITRIDE USING A SOURCE GAS COMPRISING SILICON

This application is a continuation of U.S. patent application Ser. No. 08/667,907 filed Jun. 12, 1996 now U.S. Pat. No. 5,691,235, which is a continuation of U.S. patent application Ser. No. 08/348,646, filed Nov. 30, 1994 and now abandoned.

FIELD OF THE INVENTION

The invention relates to processes for fabricating dynamic random access memories, and more particularly to the deposition of tungsten nitride.

BACKGROUND OF THE INVENTION

Tungsten nitride has been shown to be an extremely promising material for planar capacitor and gate electrode applications. Tungsten nitride is stable at high temperatures and prevents dielectric degradation in capacitor applications and acts as a barrier between polycrystalline silicon and tungsten when used as a low resistivity strapping layer in a gate electrode. In one fabrication method Alex Lahav, Karen A. Grim, and Ilan A. Blech, as described in their article, "Measurement of Thermal Expansion Coefficients of W, WSi, WN, and WSiN Thin Film Metallizations," Journal of Applied Physics 67(2), Jan. 15, 1990, page 734, prepare tungsten nitride using reactive sputtering and obtain good film properties.

Although sputtering can provide high quality films, surface step coverage is inadequate for many applications. It would be preferred to have an improved step coverage process such as chemical vapor deposition(CVD).

Nakajima et al. in an article entitled "Preparation of Tungsten Nitride Film by CVD Method Using $WF_6$," appearing in the December 1987 edition of the Journal of Electrochemical Society: SOLID-STATE SCIENCE AND TECHNOLOGY, has demonstrated chemical vapor deposition of tungsten nitride from $NH_3$ and $WF_6$ source gases in a conventional hot wall CVD system. Although hot wall CVD systems offer an advantage with respect to wafer throughput, process control and cleanliness are typically not adequate for state-of-the-art applications. Rather, single wafer cold wall deposition systems are preferred.

For a CVD process $WF_6$ and $NH_3$ offer the advantages of being readily available and providing high deposition rates. However, $WF_6$ and $NH_3$ form an adduct at low temperatures (<50° C.), and even with a cold wall system there is a minimum acceptable wall temperature to prevent adduct formation. Furthermore, byproducts of the deposition reactions can cause encroachment into silicon or polycrystalline silicon substrates and therefore the process must be modified to reduce encroachment without compromising adhesion or resistivity.

Thus, there exists a need for a CVD tungsten nitride process having good adhesion and high deposition rates while providing conformal, low resistivity films with minimal silicon encroachment.

SUMMARY OF THE INVENTION

The invention is a method for depositing tungsten nitride using chemical vapor deposition. The method uses a source gas mixture having a silicon based gas for depositing the tungsten nitride to overlie a deposition substrate.

The method is useful in the fabrication of a capacitor electrode, a contact plug, and a gate electrode due to the good adhesion, minimal silicon encroachment and low resistivity of the tungsten nitride deposited according to the method of the invention.

The invention is a non-planar storage capacitor having a tungsten nitride capacitor electrode.

BRIEF DESCRIPTION OF THE DRAWINGS

FIG. 1 is a cross-sectional view of a portion of a semiconductor substrate having various structures fabricated thereon and having a first capacitor electrode.

FIG. 2 is the cross-sectional view of FIG. 1 following the creation of a dielectric layer.

FIG. 3 is the cross-sectional view of FIG. 2 following the creation of a tungsten nitride electrode.

DETAILED DESCRIPTION

The invention is a tungsten nitride layer formed by a process of the invention in which the tungsten nitride is chemically vapor deposited from a source gas comprising a silicon based gas, such as silane. In one embodiment the invention is a semiconductor non-planar storage capacitor having a tungsten nitride capacitor electrode and is the method for forming the non-planar capacitor. Although the invention is applicable to any number of non-planar capacitors, including trench capacitors and a variety of stacked capacitors, FIGS. 1–3 depict the process steps for fabricating a stacked capacitor of the invention.

Figure 1:
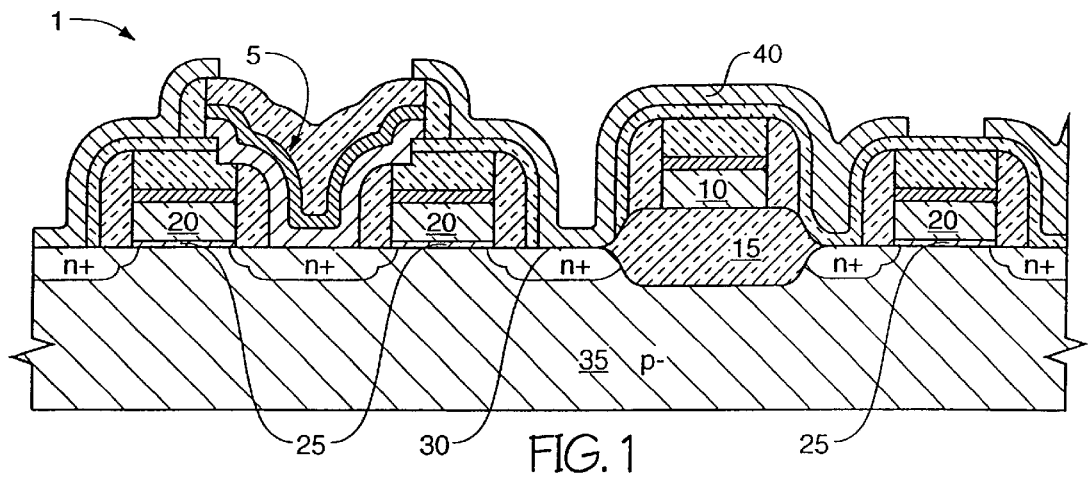
FIGS. 1–3 are cross sectional views of a semiconductor during various fabrication steps.

FIG. 1 is a cross-sectional view of a partially processed semiconductor device 1 having a buried bit line 5, a wordline 10 overlying a field oxide layer 15, and field effect transistors 20. A thin oxide layer 25 has been removed from a contact area 30 of the substrate 35 and a polycrystalline silicon (herein after also "polysilicon" or "poly") layer 40 has been deposited to overly the substrate 35 and contact the contact area 30 of the substrate 35. The poly layer 40 has been doped and patterned with a photo mask (not shown) to create a storage node plate or first electrode of the capacitor of the invention.

Figure 2:
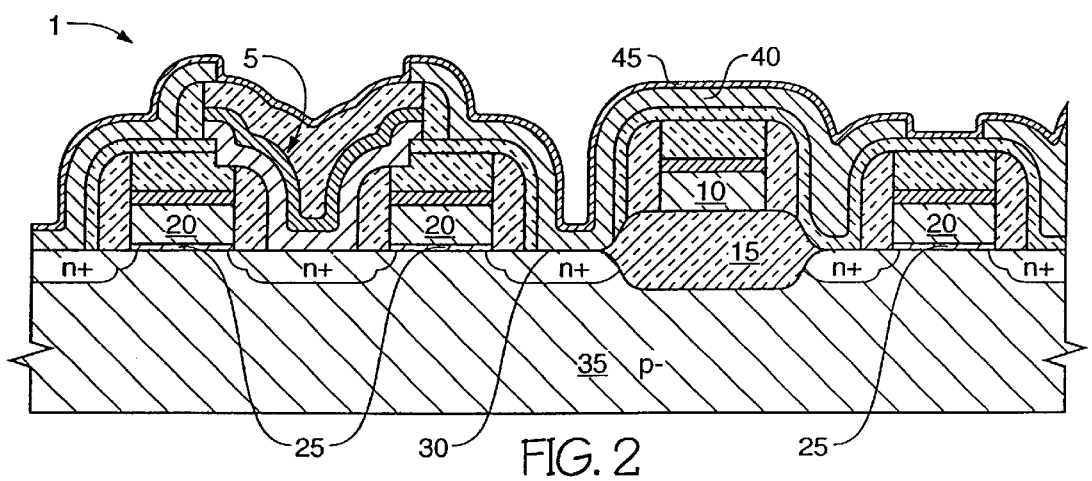

In FIG. 2 a dielectric layer 45, preferably tantalum oxide, is deposited to overly the polycrystalline silicon layer 40.

Figure 3:
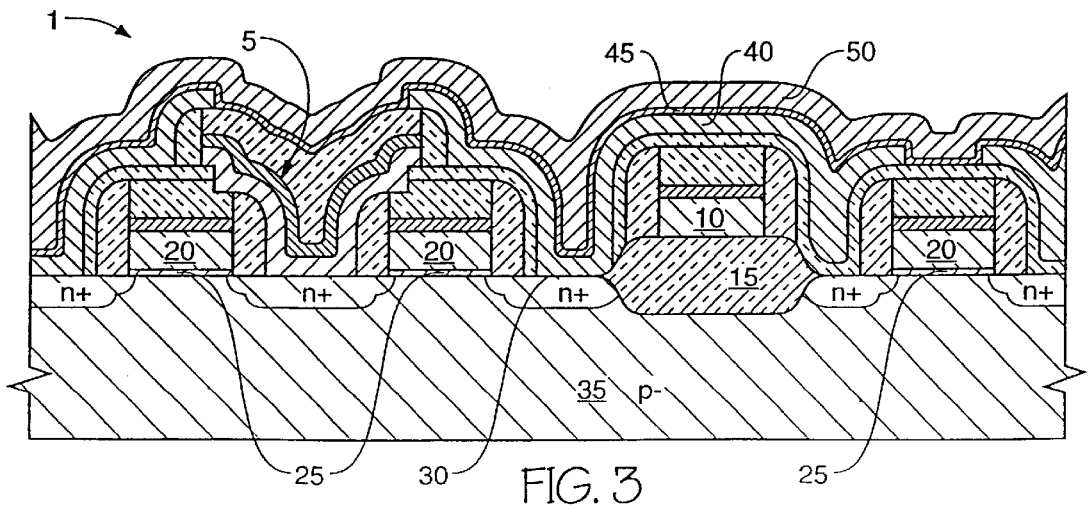

In FIG. 3 a tungsten nitride layer 50 is conformally deposited by chemical vapor deposition in a deposition chamber to overlie the dielectric layer 45 thereby forming a second electrode of the storage capacitor. During the chemical vapor deposition a source gas having at least a tungsten source such as tungsten hexaflouride combined with ammonia is combined with carrier gases which may include argon, hydrogen, nitrogen, or other gases. Alternate tungsten sources such as tungsten carbonyl may also be used. In a preferred embodiment the source gas also comprises a silicon based gas such as silane, organic silane, or a compound which is a multiple order of silane, such as di-silane and tri-silane. The source gas is maintained at a pressure conducive to chemical vapor deposition, typically within the range of pressures between 0.1 and 100 Torr including the end points. The temperature of the deposition substrate is maintained at 300° C., although other temperatures may be used. The temperature of the deposition chamber walls are held at a temperature which minimizes adduct formation, in this embodiment the walls are held at a temperature greater then 25° C. although other temperatures lower than the temperature of the deposition substrate will minimize adduct formation. In one embodiment the source gas comprises tungsten hexaflouride, ammonia, argon, and hydrogen. In this case during deposition of the tungsten nitride layer 20 the tungsten hexaflouride, ammonia, argon, and hydrogen have flow rates of 50 sccm, 150 sccm, 80 sccm and 80 sccm respectively. When silane is added to the source gas mixture the flow rate of the silane is equal to 4 sccm which is 1.098% of the total flow rate of the source gas mixture with the added silane.

In the capacitor of the invention and in other applications the addition of silane to the source gas reduces encroachment into any silicon based materials exposed to the tungsten nitride, improves adhesion of the tungsten nitride to its underlying layer, and reduces the bulk resistivity of the tungsten nitride. For most applications the flow rate of the silane or other silicon based gases should fall within the range of 0.5% to 5% of the total flow rate of the source gas comprising the silicon based gas, although flow rates from 0.1% to 25% of the total flow rate may be used.

It is possible to form the first electrode of the capacitor of the invention using the tungsten nitride when deposited according to the method described above. It is also conceivable that only the first electrode is tungsten nitride. In this case the second electrode overlying the dielectric may be some other material such as polysilicon.

Figure 4A:
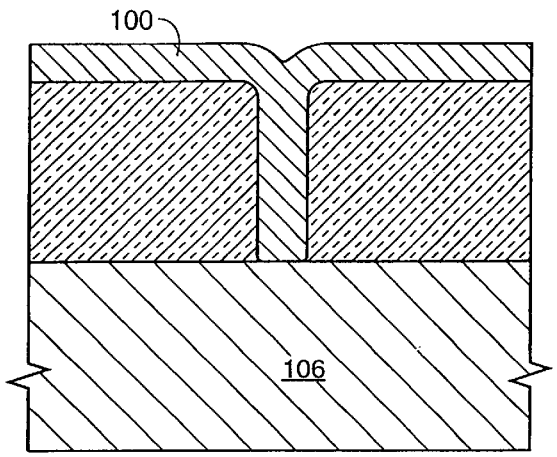
FIG. 4A is a cross-sectional view of a via formed in a substrate and filled with a layer of tungsten nitride.
Figure 4B:
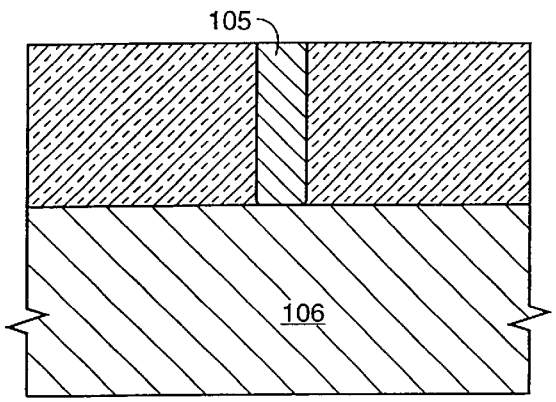
FIG. 4B is the cross-sectional view of FIG. 4A following a chemical mechanical planarization of the tungsten nitride layer of FIG. 4A.

In one embodiment the chemical vapor deposition of tungsten nitride using a source gas comprising silane is used to fill a via with tungsten nitride 100, see FIG. 4A. FIG. 4B shows the tungsten nitride contact plug 105 after chemical mechanical polishing of the tungsten nitride layer 100 shown in FIG. 4A. The contact plug 105 contacts the conductive layer 106.

Alternately the tungsten nitride may be deposited using a source gas comprising silane wherein the deposited tungsten nitride does not fill the via but rather lines the via forming a barrier material. In this case tungsten is deposited to fill the portions of the via not filled by the tungsten nitride.

Figure 5:
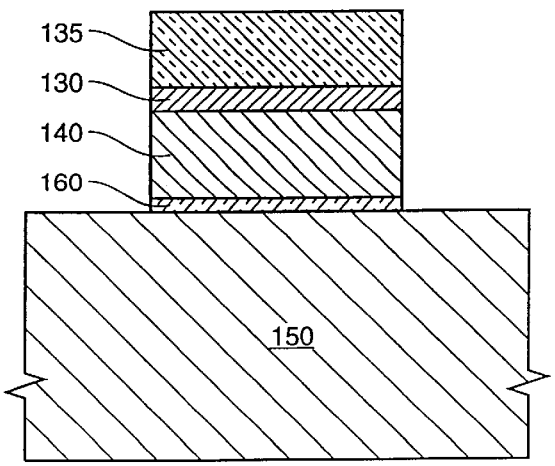
FIG. 5 is a cross-sectional view of a gate electrode having a tungsten nitride barrier layer.

In a further embodiment shown in FIG. 5 the chemical vapor deposition of tungsten nitride from a deposition gas comprising silane is used in field effect transistor applications to create a tungsten nitride barrier layer 130 interposed between a tungsten layer 135 and polycrystalline silicon layer 140. In this case exposed portions of the tungsten nitride 130, the tungsten layer 135 and the polycrystalline silicon layer 140 are removed in unpatterned areas to form a gate electrode 45 overlying substrate 150 and gate oxide 160 from masked portions of the tungsten nitride 30, the tungsten layer 135, and the polycrystalline silicon layer 140. In an alternate embodiment no polycrystalline silicon layer 140 is formed and the gate electrode comprises the tungsten nitride 130 and the tungsten layer 135.

Although specific embodiments have been described the invention should be read as limited only by the claims.

What is claimed is:

1. A method of fabricating an electrode of an integrated circuit non-planar capacitor, the method comprising:
    forming a layer of dielectric material;
    providing a source gas for use in a chemical vapor deposition process, wherein the source gas includes a source of tungsten, a silicon-containing gas and a nitrogen containing gas; and
    depositing a layer of tungsten nitride to form an electrode of the non-planar capacitor.

2. The method of claim 1 wherein the nitrogen containing gas is ammonia and the source of tungsten is tungsten hexaflouride.

3. The method of claim 1 wherein the source of tungsten is either tungsten hexaflouride or tungsten carbonyl.

4. The method of claim 1 wherein the non-planar capacitor further includes a polysilicon second electrode separated from the tungsten nitride electrode by the layer of dielectric.

5. The method of claim 1 wherein the electrode formed from tungsten nitride is deposited on the dielectric layer.

6. The method of claim 1 wherein the dielectric layer includes tantalum oxide.

7. The method of claim 1 wherein the capacitor is selected from the group comprising a stacked capacitor and a trench capacitor.

8. A method of fabricating an electrode of an integrated circuit non-planar capacitor, the method comprising:
    forming a polysilicon bottom capacitor electrode;
    forming a dielectric layer on top of the bottom electrode;
    providing a source gas for use in a chemical vapor deposition process, wherein the source gas includes a source of tungsten, a silicon-containing gas and a nitrogen containing gas; and
    depositing a layer of tungsten nitride on top of the dielectric layer to form a top electrode of the non-planar capacitor.

9. The method of claim 8 wherein the nitrogen containing gas is ammonia and the source of tungsten is tungsten hexaflouride.

10. The method of claim 8 wherein the dielectric layer comprises tantalum oxide.

11. A method of fabricating an electrode of an integrated circuit non-planar capacitor, the method comprising:
    providing a source gas for use in a chemical vapor deposition process, wherein the source gas includes a source of tungsten, a silicon-containing gas and a nitrogen containing gas;
    depositing a layer of tungsten nitride to form a bottom electrode of the non-planar capacitor;
    forming a dielectric layer on top of the bottom electrode; and
    forming a top polysilicon capacitor electrode on the dielectric layer.

12. The method of claim 11 wherein the nitrogen containing gas is ammonia and the source of tungsten is tungsten hexaflouride.

13. The method of claim 11 wherein the dielectric layer includes tantalum oxide.

14. A method of fabricating an electrode of an integrated circuit non-planar capacitor, the method comprising:
    forming a polysilicon bottom capacitor electrode;
    forming a tantalum oxide dielectric layer on top of the bottom electrode;
    providing a source gas for use in a chemical vapor deposition process, wherein the source gas includes a source of tungsten, a silicon-containing gas and ammonia; and
    depositing a layer of tungsten nitride on top of the dielectric layer to form a top electrode of the non-planar capacitor.

15. A method of fabricating an electrode of an integrated circuit non-planar capacitor, the method comprising:

providing a source gas for use in a chemical vapor deposition process, wherein the source gas includes a source of tungsten, a silicon-containing gas and ammonia;

depositing a layer of tungsten nitride to form a bottom electrode of the non-planar capacitor; and forming a tantalum oxide dielectric layer on top of the bottom electrode; and forming a top polysilicon capacitor electrode on the dielectric layer.

16. A method of fabricating an electrode of an integrated circuit non-planar capacitor, the method comprising:

providing a source gas for use in a chemical vapor deposition process, wherein the source gas includes a source of tungsten, a silane gas and a nitrogen containing gas;

depositing a first layer of tungsten nitride to form a bottom electrode of the non-planar capacitor;

forming a dielectric layer on top of the bottom electrode;

providing the source gas; and depositing a second layer of tungsten nitride on top of the dielectric layer to form a top electrode of the non-planar capacitor.

17. The method of claim 16 wherein the dielectric layer is tantalum oxide.

18. The method of claim 16 wherein the nitrogen containing gas is ammonia.

19. A method of fabricating an electrode of an integrated circuit non-planar capacitor, the method comprising:

providing a source gas for use in a chemical vapor deposition process, wherein the source gas includes a source of tungsten, silane-type gas and ammonia;

depositing a first layer of tungsten nitride to form a bottom electrode of the non-planar capacitor;

forming a tantalum oxide dielectric layer on top of the bottom electrode; providing the source gas; and depositing a second layer of tungsten nitride on top of the dielectric layer to form a top electrode of the non-planar capacitor.

* * * * *

UNITED STATES PATENT AND TRADEMARK OFFICE
CERTIFICATE OF CORRECTION

PATENT NO. : 6,429,086 B1
DATED : August 6, 2002
INVENTOR(S) : Scott G. Meikle and Trung T. Doan It is certified that error appears in the above-identified patent and that said Letters Patent is hereby corrected as shown below:

Column 2,
Line 9, insert -- - -- after "cross".

Column 3,
Line 55, delete "30" and insert -- 130 --, therefor.

Signed and Sealed this

Eleventh Day of February, 2003

JAMES E. ROGAN
*Director of the United States Patent and Trademark Office*